(12) United States Patent
Maurer et al.

(10) Patent No.: US 9,048,248 B2
(45) Date of Patent: *Jun. 2, 2015

(54) INTEGRATED CIRCUIT PACKAGE ASSEMBLY INCLUDING WAVE GUIDE

(75) Inventors: Linus Maurer, St. Georgen/Gusen (AT); Alexander Reisenzahn, Linz (AT); Markus Treml, Altmuenster (AT); Thomas Wickgruber, Linz (AT)

(73) Assignee: Infineon Technologies AG, Neubiberg (DE)

( * ) Notice: Subject to any disclaimer, the term of this patent is extended or adjusted under 35 U.S.C. 154(b) by 433 days.

This patent is subject to a terminal disclaimer.

(21) Appl. No.: 13/435,362

(22) Filed: Mar. 30, 2012

(65) Prior Publication Data

US 2012/0187511 A1 Jul. 26, 2012

Related U.S. Application Data

(62) Division of application No. 12/748,709, filed on Mar. 29, 2010, now Pat. No. 8,169,060.

(51) Int. Cl.
*H01Q 1/00* (2006.01)
*H01L 23/66* (2006.01)
(Continued)

(52) U.S. Cl.
CPC ......... *H01L 23/66* (2013.01); *H01L 2223/6627* (2013.01); *H01L 2223/6677* (2013.01); *H01L 2924/09701* (2013.01); *H01L 2924/1903* (2013.01); *H01P 5/107* (2013.01); *H01Q 1/2283* (2013.01); *H01Q 1/52* (2013.01); *H01Q 9/0407* (2013.01); *H01Q 13/06* (2013.01); *H01L 2924/0002* (2013.01)

(58) Field of Classification Search
CPC ......... H01Q 1/46; H01Q 1/362; H01Q 11/08; H01B 9/003; H01P 1/047
USPC ................... 343/905, 893; 257/662, 780, 691
See application file for complete search history.

(56) References Cited

U.S. PATENT DOCUMENTS

| 4,626,805 A | 12/1986 | Jones |
| 5,705,852 A | 1/1998 | Orihara et al. |

(Continued)

FOREIGN PATENT DOCUMENTS

| DE | 10328590 A1 | 1/2005 |
| JP | 2003078310 A | 3/2003 |

(Continued)

OTHER PUBLICATIONS

Post Wall—Wikipedia, the free encyclopedia; http://en.wikipedia.org/wiki/Post_wall; Mar. 25, 2010; p. 1. 1 Page.

(Continued)

*Primary Examiner* — Huedung Mancuso
(74) *Attorney, Agent, or Firm* — Eschweiler & Associates, LLC

(57) ABSTRACT

Some embodiments herein relate to a transmitter. The transmitter includes an integrated circuit (IC) package including a first antenna configured to radiate a first electromagnetic signal therefrom. A printed circuit board (PCB) substrate includes a waveguide configured to receive the first electromagnetic signal and to generate a waveguide signal based thereon. A second antenna can be electrically coupled to the waveguide and can radiate a second electromagnetic signal that corresponds to the waveguide signal. Other devices and methods are also disclosed.

16 Claims, 3 Drawing Sheets

(51) Int. Cl.
*H01P 5/107* (2006.01)
*H01Q 1/22* (2006.01)
*H01Q 1/52* (2006.01)
*H01Q 9/04* (2006.01)
*H01Q 13/06* (2006.01)

(56) References Cited

U.S. PATENT DOCUMENTS

| | | | |
|---|---|---|---|
| 5,903,239 | A | 5/1999 | Takahashi et al. |
| 7,095,292 | B2 | 8/2006 | Sayanagi et al. |
| 7,119,745 | B2 | 10/2006 | Gaucher et al. |
| 7,616,167 | B2 | 11/2009 | Anzai |
| 7,728,774 | B2 | 6/2010 | Akkermans et al. |
| 7,825,810 | B2 | 11/2010 | Sakama et al. |
| 7,893,878 | B2 * | 2/2011 | Rofougaran ........... 343/700 MS |
| 8,053,878 | B2 | 11/2011 | Iwamura et al. |
| 8,674,888 | B2 * | 3/2014 | Rofougaran ................. 343/722 |
| 2003/0042993 | A1 | 3/2003 | Sayanagi et al. |
| 2006/0017157 | A1 | 1/2006 | Yamamoto et al. |
| 2006/0255961 | A1 | 11/2006 | Hofer et al. |
| 2007/0026567 | A1 | 2/2007 | Beer et al. |
| 2007/0040281 | A1 | 2/2007 | Nakayama et al. |
| 2008/0068269 | A1 | 3/2008 | Yamada |
| 2008/0105964 | A1 | 5/2008 | Iwamura et al. |
| 2008/0105966 | A1 | 5/2008 | Beer et al. |
| 2008/0291115 | A1 | 11/2008 | Doan et al. |
| 2009/0066590 | A1 | 3/2009 | Yamada et al. |
| 2009/0231225 | A1 | 9/2009 | Choudhury et al. |
| 2009/0289860 | A1 | 11/2009 | Lee et al. |
| 2011/0028103 | A1 | 2/2011 | Rofougaran |
| 2011/0163919 | A1 | 7/2011 | Suzuki |
| 2011/0175793 | A1 | 7/2011 | Suzuki |
| 2012/0249380 | A1 * | 10/2012 | Soler Castany et al. ...... 343/702 |

FOREIGN PATENT DOCUMENTS

| | | |
|---|---|---|
| JP | 2008068269 A | 3/2008 |
| JP | 2008124080 A | 5/2008 |
| JP | 2009081833 A | 4/2009 |
| JP | 2009225199 A | 10/2009 |
| WO | 2010026990 A1 | 3/2010 |

OTHER PUBLICATIONS

Waveguide (optics)—Wickipedia, the free encyclopedia; http://en.wikipedia.org/wiki/Waveguide_%28optics%29; Mar. 25, 2010; p. 1-3. 3 Pages.

Recommendations for Printed Circuit Board Assembly of Infineon xWLy Packages; Published by Infineon Technologies AG 2008, Edition May 2008, 1-24. 24 Pages.

Non-Final Office Action Dated Sep. 7, 2011 for U.S. Appl. No. 12/748,709. 15 Pages.

Notice of Allowance Dated Dec. 30, 2011 for U.S. Appl. No. 12/748,709. 14 Pages.

* cited by examiner

INTEGRATED CIRCUIT PACKAGE ASSEMBLY INCLUDING WAVE GUIDE

REFERENCE TO RELATED APPLICATION

This application is a divisional of U.S. patent application Ser. No. 12/748,709 filed on Mar. 29, 2010.

BACKGROUND

Integrated circuit (IC) packaging is generally considered to be the final stage of IC fabrication and occurs after a disc-like semiconductor wafer, which often includes a large number of IC dies thereon, is diced up to provide a number of separate ICs. Because the features on each die are often too small to be practically coupled together in a larger circuit, these dies are packaged in an IC package to facilitate effective integration. Some conventional examples of IC packages include flat packs, dual-inline packages (DIPs) and numerous others, which can be fabricated from ceramic, plastic, or other more exotic materials.

Although effective in many regards, conventional IC packages suffer from significant shortcomings when designers attempt to integrate them with high frequency (e.g., radio-frequency (RF) or millimeter wave) components. For example, significant power losses often occur at high frequencies, which can be due, at least in part, to the connection between the conventional IC package and the high frequency component.

To improve integration of high-frequency components with respect to packaging, aspects of the present disclosure are directed toward improved IC package assemblies and method associated therewith.

DETAILED DESCRIPTION

Figure 1:
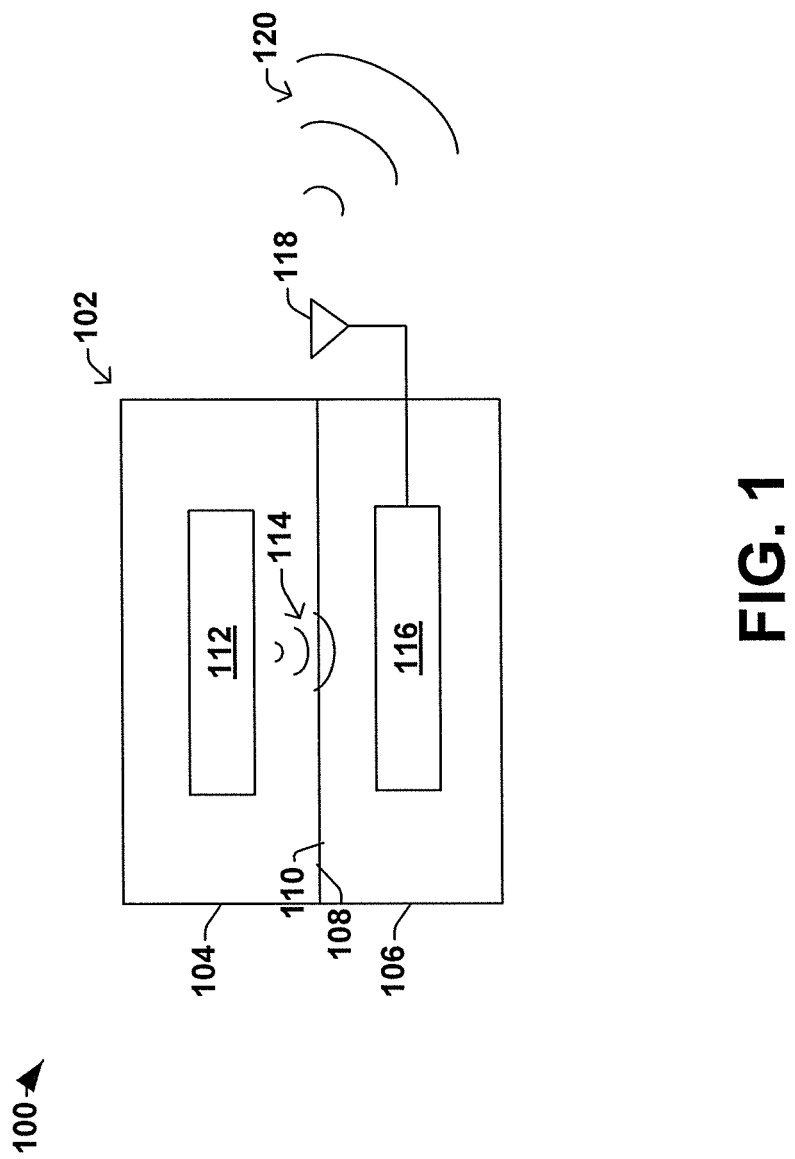
FIG. 1 is a block diagram illustrating transmitter in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. Further, although the terms "top", "bottom", "side" and other similar terms are used herein, these terms do not imply any type of absolute reference frame, and in other embodiments the "top", "bottom", "side" and other elements may be permuted in various ways not depicted in the figures.

FIG. 1 shows a transmitter 100 in accordance with some embodiments. As shown, the transmitter 100 includes an integrated circuit (IC) package assembly 102 that includes an IC package 104 and a printed circuit board (PCB) substrate 106. The IC package 104 has a first engagement surface 108, which is physically coupled to a corresponding engagement surface 110 of the PCB substrate 106.

The IC package 104 houses a first antenna 112 that is configured to radiate a first electromagnetic signal 114 therefrom. However, because the IC package 104 typically has a relatively small area due to packaging limitations (e.g., 6 mm×6 mm), the first antenna 112 may in some instances have a relatively small antenna gain.

Therefore, the PCB substrate 106 includes a waveguide 116 configured to receive the first electromagnetic signal 114. The waveguide 116 generates a waveguide signal based on the first electromagnetic signal, and passes the waveguide signal to a second antenna 118 that is electrically coupled to the waveguide 116. The second antenna 118, which often has an antenna gain that is greater than that of the first antenna 112, is configured to radiate a second electromagnetic signal 120 that corresponds to the first electromagnetic signal, albeit with an increased power spectral density. Because the first antenna 112 is integrated into the IC package 104, integration and assembly of the transmitter 100 is streamlined. At the same time, the transmitter 100 provides a relatively large antenna gain because the waveguide 116 makes it possible to transmit the desired signal via the second antenna 118.

Figures 2, 3:
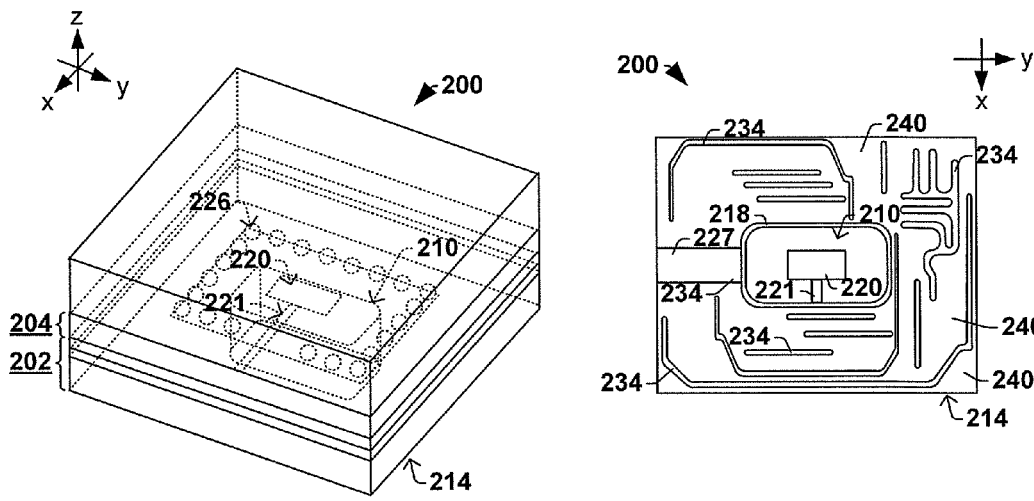
FIG. 2 is a perspective view illustrating an IC package assembly in accordance with some embodiments.
FIG. 3 is a bottom view of the IC package assembly of FIG. 2.
Figure 4:
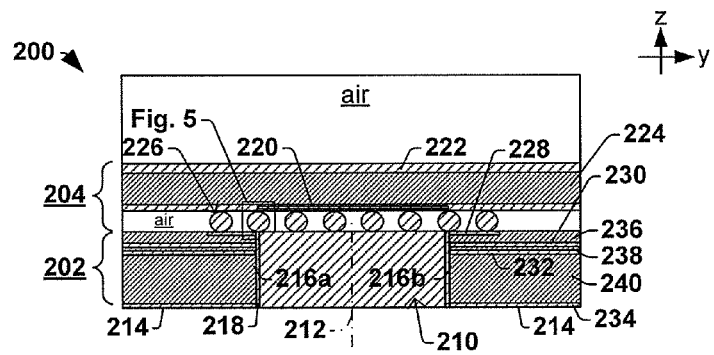
FIG. 4 is a cross-sectional side view of the IC package assembly of FIG. 2.
Figure 5:
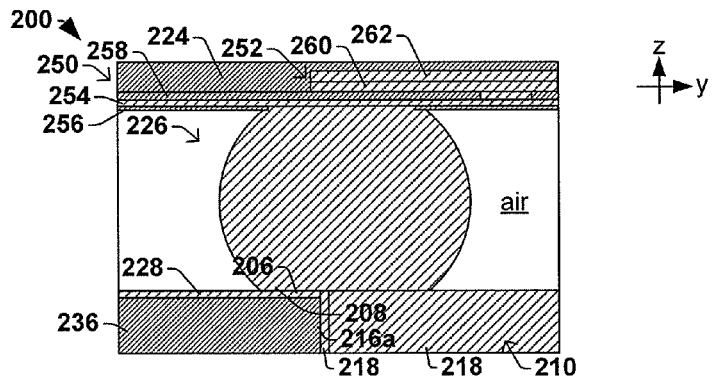
FIG. 5 is a detailed view of one portion of FIG. 4's cross-sectional side-view, as indicated.

Turning now to FIGS. 2-5 collectively, one can see a more detailed example of an IC package assembly 200 in accordance with some embodiments. FIG. 2 shows a perspective view, FIG. 3 shows a bottom view, and FIGS. 4-5 show cross-sectional sideviews.

Notably, FIGS. 2-5 do not depict a second antenna (e.g., 118 in FIG. 1) because the second antenna may be later coupled to the IC package assembly 200 and is not required to be included in the IC package assembly itself. As generally shown in these figures, the IC package assembly 200 includes a PCB substrate 202 and an IC package 204, which are physically coupled to one another at respective engagement surfaces 206, 208 (see FIG. 5).

An aperture 210 defined in the PCB substrate's engagement surface 206 extends along an aperture axis 212 through the PCB substrate 202 and out an opposing surface 214 of the PCB substrate 202. In this way, the aperture 210 defines parallel inwardly-facing sidewalls (e.g., 216a, 216b) in the PCB substrate 202. A conductive layer 218, which acts as a waveguide, is disposed completely around an inner perimeter defined by the inwardly-facing sidewalls.

A first antenna 220, such as a patch antenna for example, is housed in the IC package 204 and receives a transmission signal via a waveguide 221 (e.g., a conductive line, such as a co-planar waveguide, in planar technology). The first antenna 220 is positioned on the aperture axis 212 and is configured to radiate an electromagnetic wave based on the transmission signal. Although the antenna 220 tends to radiate power along the aperture axis 212, it can also radiate power in other directions.

A conductive layer 222 (which, in the illustrated embodiment extends entirely over a top dielectric layer 224 of the IC package 204) reflects power radiated from the first antenna back towards the aperture 210. In addition, a solder ball arrangement 226 has an inner perimeter that laterally surrounds the first antenna 220. Because both of these components 222, 226 are made of conductive material, they tend to reflect power being radiated from the first antenna back out the aperture 210, thereby helping to improve efficiency.

Because energy from the electromagnetic wave passes through the aperture 210, a waveguide mode with corresponding electromagnetic field is excited in the conductive layer 218 so as to reflect changes in the electromagnetic wave in time. In this way, the conductive layer 218 acts as a waveguide in that it generates a waveguide signal that corresponds to the time-varying characteristics of the electromagnetic wave. This waveguide signal is then passed, via a conductive layer in the PCB substrate 227, to a second antenna (not shown), where it can be re-transmitted at a suitable power.

It will be appreciated that many variations of this arrangement are contemplated as falling within the scope of this disclosure. For example, although the aperture 210 is illustrated having a rectangular geometry with rounded corners, the aperture in other embodiments could have other geometries (e.g., oval-shaped, circular-shaped, or polygon-shaped with rounded edges). Although rounded edges are not required, it is often easier and more cost-effective to manufacture apertures with such rounded edges.

The conductive layer 218 can also take various forms depending on the implementation. In some embodiments, the conductive layer 218 can comprise gold, while in other embodiments the conductive layer 218 can comprise copper, aluminum or another conductive material.

The PCB substrate 202 can also take various forms depending on the implementation. The illustrated PCB substrate 202, for example, includes a top conductive layer 228 (e.g., about 35 µm thick), two inner conductive layers (230, 232, each having a thickness of about 35 µm, for example), and a bottom conductive layer 234 (e.g., about 35 µm thick). These conductive layer(s) often comprise copper, but could also comprise gold, aluminum or another conductive material. As can be seen from FIG. 3, the bottom conductive layer 234 can be patterned into electrical conduits that route electrical signals in various ways between the various electrical components coupled to the PCB board. The other conductive layers can be similarly pattered to route electrical signals.

To provide isolation between these PCB conductive layers, the PCB substrate 202 also includes an upper dielectric layer 236 (e.g., about 200 µm thick), a middle dielectric layer 238 (e.g. about 200 µm thick), and a lower dielectric layer 240 (e.g., about 200 µm thick). In one embodiment, the dielectric layer(s) can comprise FR-4 epoxy, but could also comprise other dielectric materials in other embodiments. Although four conductive layers and three dielectric layers are illustrated, it will be appreciated that fewer layers (e.g., only a single conductive layer and a single dielectric layer), or many more layers can be present, depending on the implementation.

Further, the illustrated IC package 204 includes a redistribution layer 250 coupling the solder ball arrangement to an IC 252 (e.g., the antenna or a separate IC) in the IC package, as seen in FIG. 5. The redistribution layer 250 includes a RDL conductive layer 254 (e.g., copper) sandwiched between dielectric layers 256, 258. The lower of these dielectric layers 256 has an opening at which a solder ball 226 is electrically coupled to the RDL conductive layer 254. A via or other vertical connection then couples the RDL conductive layer 254 to upper layers 260 on the IC. For example, these upper layers 260 often include interconnect layers and bond pads for the IC, while transistors and other devices are typically included in a substrate region 262 of the IC.

Figure 6:
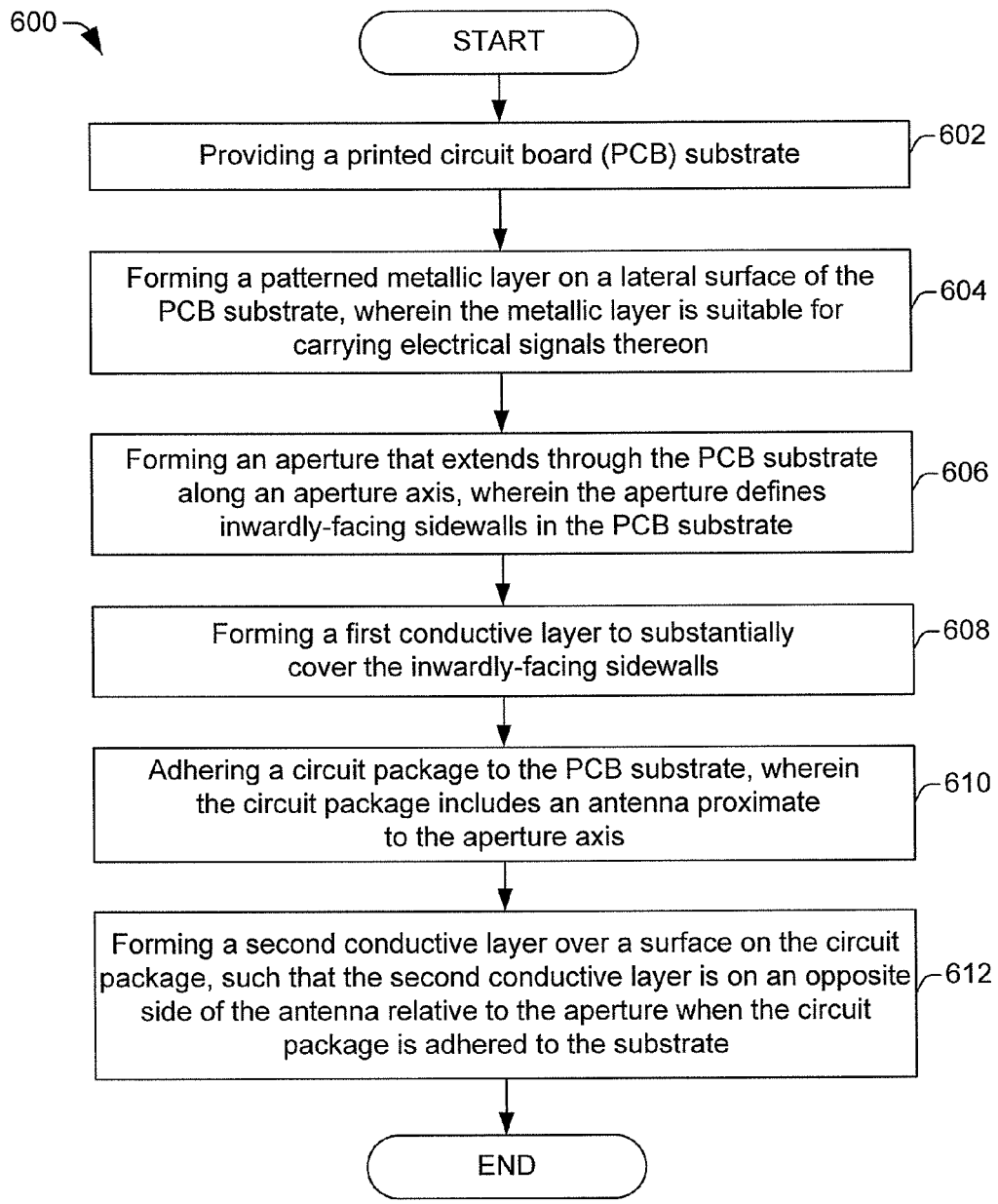
FIG. 6 is a flow chart depicting a method in accordance with some embodiments.

Turning now to FIG. 6, one can see a method 600 in accordance with some embodiments. While this method is illustrated and described below as a series of acts or events, the present disclosure is not limited by the illustrated ordering of such acts or events. The same is true for other methods disclosed herein. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

At block 602, a printed circuit board (PCB) substrate is provided. In many embodiments, the PCB substrate is an epoxy-based substrate, such as FR-4 epoxy for example.

At block 604, one or more metallic layers are patterned on a lateral surface of the PCB substrate. The metallic layer is suitable for carrying electrical signals thereon. In many embodiments, this metallic layer is formed by bonding a layer of copper over the entire PCB substrate, sometimes on both sides. In these embodiments, unwanted portions of the copper are then removed after applying a temporary mask (e.g. by etching), leaving only the desired copper traces. In other embodiments, the copper traces can be made by adding traces to the bare PCB substrate (or a substrate with a very thin layer of copper) usually by a process of multiple electroplating steps.

At block 606, an aperture is formed in the PCB substrate. Typically, this aperture is formed by mechanical techniques (e.g., a drill), but it could also be formed by chemical techniques (e.g., etching), or combinations of chemical and mechanical techniques. The aperture often extends through the PCB substrate along an aperture axis so as to define inwardly-facing sidewalls in the PCB substrate.

At block 608, a first conductive layer is formed on at least of the inwardly-facing sidewalls. This conductive layer can comprise gold, aluminium, or another conductive material; and can be formed in by sputtering or electroplating techniques, among others.

At block 610, an IC package is adhered to the PCB substrate. Typically, the IC package includes an antenna proximate to the aperture axis. In some embodiments, this adherence is achieved by adhering at least one solder-ball to the metallic layer formed in block 604.

At block 612, a second conductive layer is formed over an external surface on the IC package. The second conductive layer is on an opposite side of the antenna relative to the aperture when the IC package is adhered to the substrate. Often, this second conductive layer helps to reflect power radiated from the antenna back towards the aperture. Because of this, the second conductive layer is often a continuous surface extending entirely over the external surface of the IC package.

Although the disclosure has been shown and described with respect to one or more implementations, equivalent alterations and modifications will occur to others skilled in the art based upon a reading and understanding of this specification and the annexed drawings. For example, although FIGS. 2-5 show an embodiment where an IC package assembly 200 where an IC antenna 220 radiates a signal through an aperture 210 in the PCB substrate into a waveguide 218, this example is not limiting. In other embodiments, the aperture is not required and the waveguide 218 can be encased entirely or partially within the PCB dielectric (e.g., LTCC, HTCC). In such an embodiment, the IC antenna 220 would radiate its RF signal through the PCB dielectric material (LTCC, HTCC) and into a waveguide embedded in the dielectric material (e.g., waveguide 116 in FIG. 1). The waveguide embedded in the dielectric material would then carry the detected signal to a second (high gain) antenna for retransmission, such as shown in FIG. 1, for example The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A method of manufacturing an integrated circuit (IC) package assembly, comprising:
   providing a printed circuit board (PCB) substrate;
   forming a patterned metallic layer on a lateral surface of the PCB substrate, wherein the patterned metallic layer is suitable for carrying electrical signals thereon;
   forming an aperture that extends through the PCB substrate along an aperture axis, wherein the aperture defines inwardly-facing sidewalls in the PCB substrate;
   forming a first conductive layer to conformally cover the inwardly-facing sidewalls and laterally circumscribe the aperture; and
   adhering an IC package to the PCB substrate, wherein the IC package includes an antenna proximate to the aperture axis and configured to generate an electromagnetic wave, and wherein the first conductive layer is arranged to induce a time-varying signal thereon, wherein the time-varying signal is indicative of the power of the electromagnetic wave over time.

2. The method of claim 1, further comprising:
   forming a second conductive layer over a surface on the IC package, such that the second conductive layer is on an opposite side of the antenna relative to the aperture when the IC package is adhered to the PCB substrate.

3. The method of claim 2, wherein adhering the IC package to the PCB substrate comprises adhering at least one solder-ball to the patterned metallic layer on the lateral surface of the PCB substrate.

4. An integrated circuit package assembly, comprising:
   an integrated circuit (IC) package including a first antenna configured to radiate a first electromagnetic signal therefrom;
   a substrate physically coupled to a surface of the IC package, wherein the substrate includes a waveguide configured to wirelessly receive the first electromagnetic signal and to generate a waveguide signal based thereon; and
   a second antenna electrically coupled to the waveguide and configured to radiate a second electromagnetic signal that corresponds to the first electromagnetic signal by using the waveguide signal.

5. The integrated circuit package assembly of claim 4, wherein the first antenna has a first antenna gain and the second antenna has a second antenna gain, the second antenna gain being greater than the first antenna gain.

6. The integrated circuit package assembly of claim 4, wherein the waveguide comprises a conductive layer encased entirely in the substrate.

7. The integrated circuit package assembly of claim 4, wherein the substrate is a PCB substrate.

8. The integrated circuit package assembly of claim 4, wherein the substrate has an aperture extending therethrough, the aperture defining inwardly-facing sidewalls in the substrate.

9. The integrated circuit package assembly of claim 8, wherein the waveguide comprises a conductive layer disposed at least partially about an inner perimeter of the aperture defined by the inwardly-facing sidewalls.

10. The integrated circuit package assembly of claim 9, wherein the conductive layer comprises at least one of: gold, copper, or aluminum.

11. An integrated circuit (IC) package assembly, comprising:
    a substrate having an aperture extending there through along an aperture axis, wherein the aperture is defined by inwardly-facing sidewalls of the substrate;
    an antenna positioned proximate to the aperture axis and configured to generate an electromagnetic wave; and
    a first conductive layer conformally disposed on the inwardly-facing sidewalls and laterally circumscribing the aperture, wherein the first conductive layer is arranged to induce a time-varying signal thereon, wherein the time-varying signal is indicative of the power of the electromagnetic wave over time.

12. The IC package assembly of claim 11, further comprising:
    a second conductive layer formed on an opposite side of the antenna relative to the aperture, wherein the second conductive layer is configured to reflect power from the antenna incident on the second conductive layer back towards the aperture.

13. The IC package assembly of claim 11, further comprising:
    an arrangement of conductive balls having a perimeter associated therewith, wherein the arrangement's perimeter is disposed laterally about the aperture axis proximate to the antenna.

14. The IC package assembly of claim 13, further comprising:
    a waveguide traversing the perimeter associated with the arrangement of conductive balls, wherein the waveguide extends along a lateral surface of the substrate and is electrically coupled to the antenna.

15. The IC package assembly of claim 14, further comprising:
    a second conductive layer formed on an opposite side of the antenna relative to the aperture, wherein the second conductive layer extends in a generally perpendicular manner with respect to the first conductive layer.

16. An integrated circuit (IC) package assembly, comprising:
    a substrate having an aperture extending there through along an aperture axis, wherein the aperture is defined by inwardly-facing sidewalls of the substrate;
    an antenna positioned proximate to the aperture axis and configured to generate an electromagnetic wave;
    a first conductive layer disposed on the inwardly-facing sidewalls, disposed at least partially about the aperture axis, and arranged to induce a time-varying signal thereon, wherein the time-varying signal is indicative of the power of the electromagnetic wave over time; and an arrangement of conductive balls having a perimeter associated therewith, wherein the arrangement's perimeter is disposed laterally about the aperture axis proximate to the antenna.

* * * * *